(12) United States Patent
Whitehead et al.

(10) Patent No.: US 11,320,475 B2
(45) Date of Patent: *May 3, 2022

(54) TESTING SYSTEM FOR TRAVELING WAVE FAULT DETECTORS

(71) Applicant: Schweitzer Engineering Laboratories, Inc., Pullman, WA (US)

(72) Inventors: David E. Whitehead, Pullman, WA (US); Tony J. Lee, Henderson, NV (US); Zachary King Sheffield, Pullman, WA (US); Tracey G. Windley, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 219 days.

This patent is subject to a terminal disclaimer.

(21) Appl. No.: 16/792,814

(22) Filed: Feb. 17, 2020

(65) Prior Publication Data

US 2020/0182956 A1 Jun. 11, 2020

Related U.S. Application Data

(63) Continuation of application No. 15/293,171, filed on Oct. 13, 2016, now Pat. No. 10,564,246.

(60) Provisional application No. 62/240,608, filed on Oct. 13, 2015.

(51) Int. Cl.
| | |
|---|---|
| *G01R 31/08* | (2020.01) |
| *G01R 31/11* | (2006.01) |
| *G01R 31/327* | (2006.01) |
| *H02H 1/00* | (2006.01) |
| *H02H 7/26* | (2006.01) |
| *G01R 35/00* | (2006.01) |

(52) U.S. Cl.
CPC ............ *G01R 31/086* (2013.01); *G01R 31/11* (2013.01); *G01R 31/3272* (2013.01); *G01R 35/00* (2013.01); *H02H 1/0007* (2013.01); *H02H 7/265* (2013.01)

(58) Field of Classification Search
CPC .. G01R 31/086; G01R 31/11; G01R 31/3272; G01R 35/00; G01R 31/085; H02H 1/0007; H02H 7/265
See application file for complete search history.

(56) References Cited

U.S. PATENT DOCUMENTS

| | | | | |
|---|---|---|---|---|
| 9,383,735 | B2* | 7/2016 | Schweitzer, III | ...... G05B 13/02 |
| 10,564,246 | B2* | 2/2020 | Whitehead | ............. G01R 31/11 |
| 11,047,892 | B2* | 6/2021 | Obbalareddi Demudu | ................. H02H 7/265 |

* cited by examiner

*Primary Examiner* — Amy He
(74) *Attorney, Agent, or Firm* — Richard M. Edge; Jared L. Cherry

(57) ABSTRACT

A testing apparatus for imposing a traveling wave signal on an electric system signal for testing a fault detector is disclosed herein. The fault detector may be configured to simulate a fault at a particular location by controlling the timing of the traveling wave signal. The testing apparatus may be configured to impose multiple traveling wave signals to test the accuracy of the fault location determined by the fault detector. The testing apparatus may be configured to determine the calculation accuracy of the fault detector. The testing apparatus may impose a traveling wave signal on a signal simulating an electrical signal on an electric power delivery system. The testing apparatus may be used to test capabilities of a fault detector of detecting a fault using traveling waves or incremental quantities.

20 Claims, 8 Drawing Sheets

TESTING SYSTEM FOR TRAVELING WAVE FAULT DETECTORS

RELATED APPLICATION

The present application claims priority as a continuation of U.S. patent application Ser. No. 15/293,171, filed on 13 Oct. 2016, titled "Testing System for Traveling Wave Fault Detectors," (now U.S. Pat. No. 10,564,246), which claims priority under 35 U.S.C. § 119(e) to U.S. Provisional Patent Application No. 62/240,608, filed Oct. 13, 2015, titled "Testing System for Traveling Wave Fault Detectors," which is hereby incorporated by reference in its entirety.

TECHNICAL FIELD

This disclosure relates to testing systems for traveling wave fault detectors. More particularly, this disclosure relates to a system for creating and injecting a signal representative of a traveling wave for testing a traveling wave fault detector.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1A:
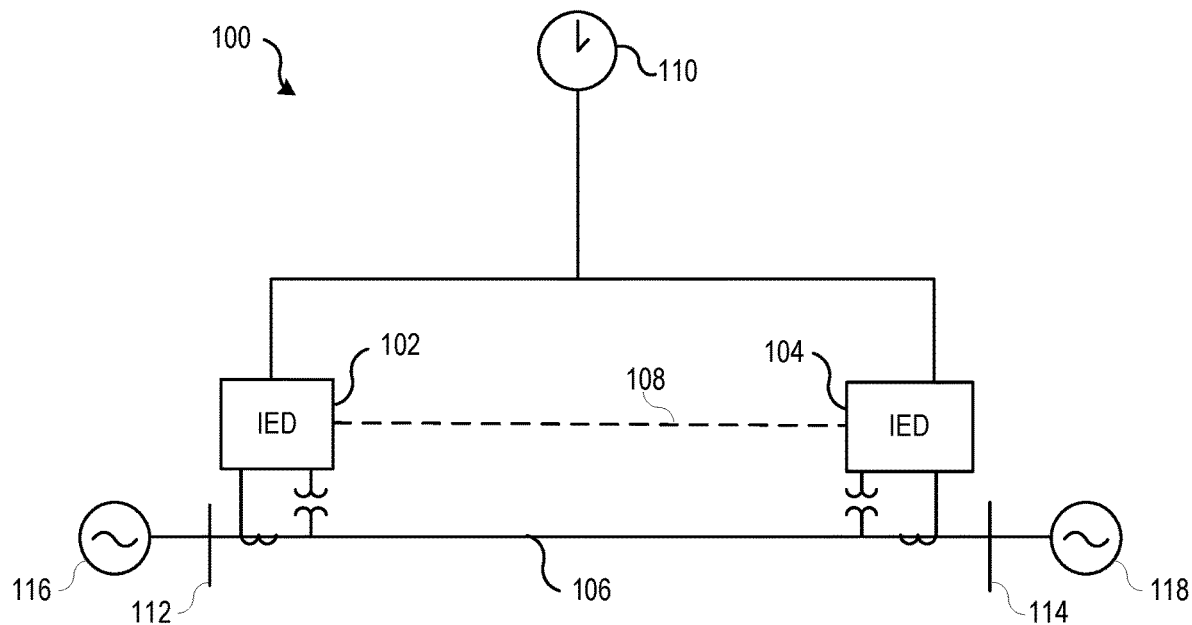
FIG. 1A illustrates a simplified one-line diagram of an electric power delivery system including a protection system capable of detecting traveling waves consistent with certain embodiments of the present disclosure.

Protection of electric power delivery systems benefits from fast, secure, dependable fault detection. Intelligent electronic devices ("IEDs") are often used to detect conditions on the electric power delivery system and take protective actions in response to a detected condition. Most protection principles are based on the fundamental frequency components of voltages and currents. Accurate measurement of a sinusoidal quantity typically takes one cycle. Such IEDs may be tested using a current signal generator that is configured to output a signal representative of a current signal that may be present on the electric power delivery system. For example, such a generator may be configured to output a 60 Hz current waveform representative of the 60 Hz current waveform of an electric power delivery system. The signal generator may be further configured to simulate a fault condition by generating variations in the current waveform representing overcurrent conditions; however, such signal generators typically do not generate signals representative of traveling waves.

High-speed protection devices may respond to high-frequency signal components, which may be used to detect faults and to realize various advantages. For example, certain nontraditional energy, such as wind and solar, are connected to the power system through a power electronics interface. As such, these sources typically have little or no inertia. Their control algorithms protect the converters for network fault conditions. As a result, these sources produce voltages and currents that challenge some protection principles developed for networks with synchronous generators. In contrast, high-speed protection devices configured to respond to high-frequency signal components are less dependent on the sources and more dependent on the network itself. As a result, such relays may be useful in applications near nontraditional sources.

Various embodiments consistent with the present disclosure may analyze traveling waves (TWs) to aid in the detection of faults. When a fault occurs in an electric power system, traveling waves are launched from the fault and travel outward at a velocity near the speed of light. The traveling waves are reflected by buses and other discontinuities according to their corresponding characteristic impedances. In the initial stage of the fault, the electric power system may behave like a distributed parameter network. Accordingly, the traveling waves may be described by the propagation velocity, the reflection and transmission coefficients, and the line characteristic impedance. Using a traveling wave detection algorithm, a high-speed relay may be able to detect a fault and initiate corrective action in less than 1 millisecond consistent with certain embodiments of the present disclosure. Various elements disclosed herein may be implemented using high-speed sampling systems and high-speed systems for filtering, integration, comparison, timers, and logic operations to improve the response time of such elements.

Several IEDs are presently available for detection of traveling waves on electric power delivery systems. Such IEDs respond to high-frequency signal components that are not generated by traditional IED testing devices. A test system operable to generate signals representative of traveling waves may provide for reliable testing of such IEDs and for refinement of the operation of such IEDs to further improve the speed or dependability of such IEDs.

Described herein are various embodiments of systems for testing traveling wave detectors, such as traveling wave detecting IEDs. Systems described herein may be configured to create and inject signals that are representative of traveling waves on an electric power delivery system. Further, such systems may be used to test the response of a system, such as an IED, configured to detect traveling waves for purposes of fault detection or protection of electrical power distribution.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1A illustrates a block diagram of a system 100 for detecting and calculating a location of a fault using time-domain principles and elements further described herein. System 100 may include generation, transmission, distribution and/or similar systems. System 100 includes a conductor 106 such as a transmission line connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by IEDs 102 and 104 at two locations of the system, although further IEDs may also be utilized to monitor further locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs), potential transformers (PTs), Rogowski coils, voltage dividers, low energy analog (LEA) inputs, and/or the like. IEDs 102, 104 may be capable of using inputs from conventional instrument transformers such as CTs and PTs conventionally used in monitoring of electric power delivery. IEDs 102 and 104 may also receive common time information from a common time source 110.

Common time source 110 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG, a WWWB or WWWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, voltages, currents, time-domain fault detection and location. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, Mirrored-Bits®, or the like, in order to communicate data.

Figure 1B:
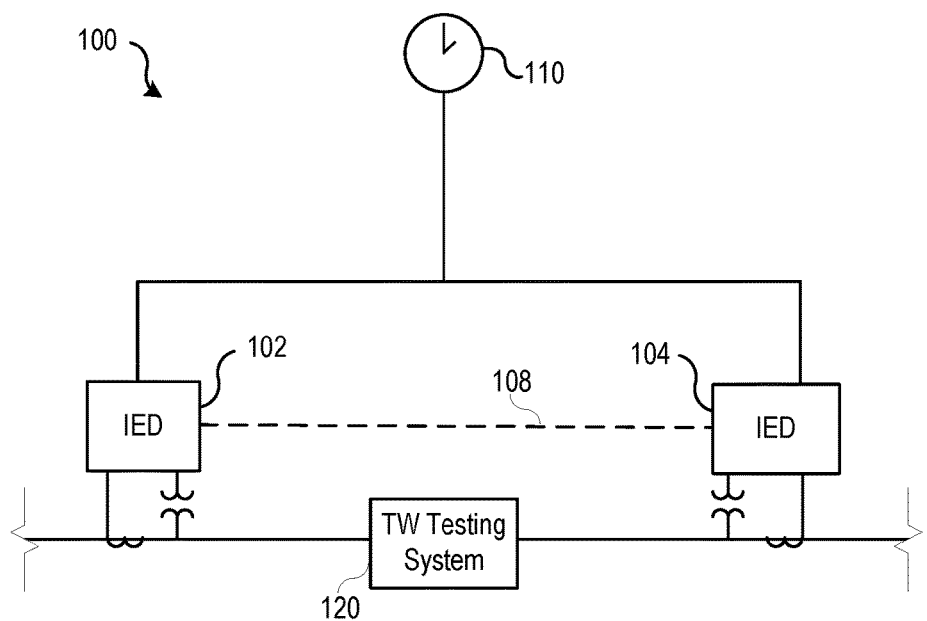
FIG. 1B illustrates a simplified one-line diagram of the electric power delivery system illustrated in FIG. 1A, in which traveling waves on a transmission line are simulated by a traveling wave testing system consistent with certain embodiments of the present disclosure.

FIG. 1B illustrates a simplified one-line diagram of the electric power delivery system illustrated in FIG. 1A, in which traveling waves on transmission line 106 are simulated by a traveling wave testing system 120 consistent with certain embodiments of the present disclosure. A testing system consistent with the present disclosure may simulate traveling waves on an arbitrarily long transmission line by adjusting the timing of the simulated traveling waves. Further, the location of the fault may also be controlled using the timing of the simulated traveling waves. For example, a traveling wave generated by a simulated fault that is closer to IED 102 would reach IED 102 before reaching IED 104. Accordingly, traveling wave testing system 120 may generate a first signal representing the traveling wave that is received by IED 102 before generating a second signal representing the traveling wave that is received by IED 104. The simulated location of the fault may be determined based on the time difference between the first signal and the second signal using Eq. 1.

$$m = \frac{1}{2}[L + (t_L - t_R) \cdot v] \qquad \text{Eq. 1}$$

where: $t_L$ is the front wave arrival time at IED 102,
$t_R$ is the front wave arrival time at IED 104,
v is the wave propagation speed, and
L is the line length.

Two-end fault locating methods, which may be referred to herein as Type D methods, may use a time difference between a traveling wave captured at both terminals along with the line length and wave propagation velocity to compute the fault location using Eq. 1. In addition, or in the alternative, single-end fault locating methods may also be utilized by one of IEDs 102 and 104, and traveling wave testing system 120 may be configured to simulate appropriate testing conditions. Single-end fault locating methods may be referred to as a Type A fault locating method, which uses the time difference between the first arrived traveling wave and a subsequent reflection from the fault or the remote terminal. In certain embodiments, a distance to a fault location (m) may be calculated using the Type A method using Equation 2.

$$m = \left(\frac{t_{L2} - t_{L1}}{2}\right) \cdot v \qquad \text{Eq. 2}$$

where: $t_{L2}$ is the arrival time of the first reflection from the fault at the L Terminal;
$t_{L1}$ is the arrival time of the initial wave front from the fault at the L Terminal; and
v is the wave propagation speed.

Figure 2:
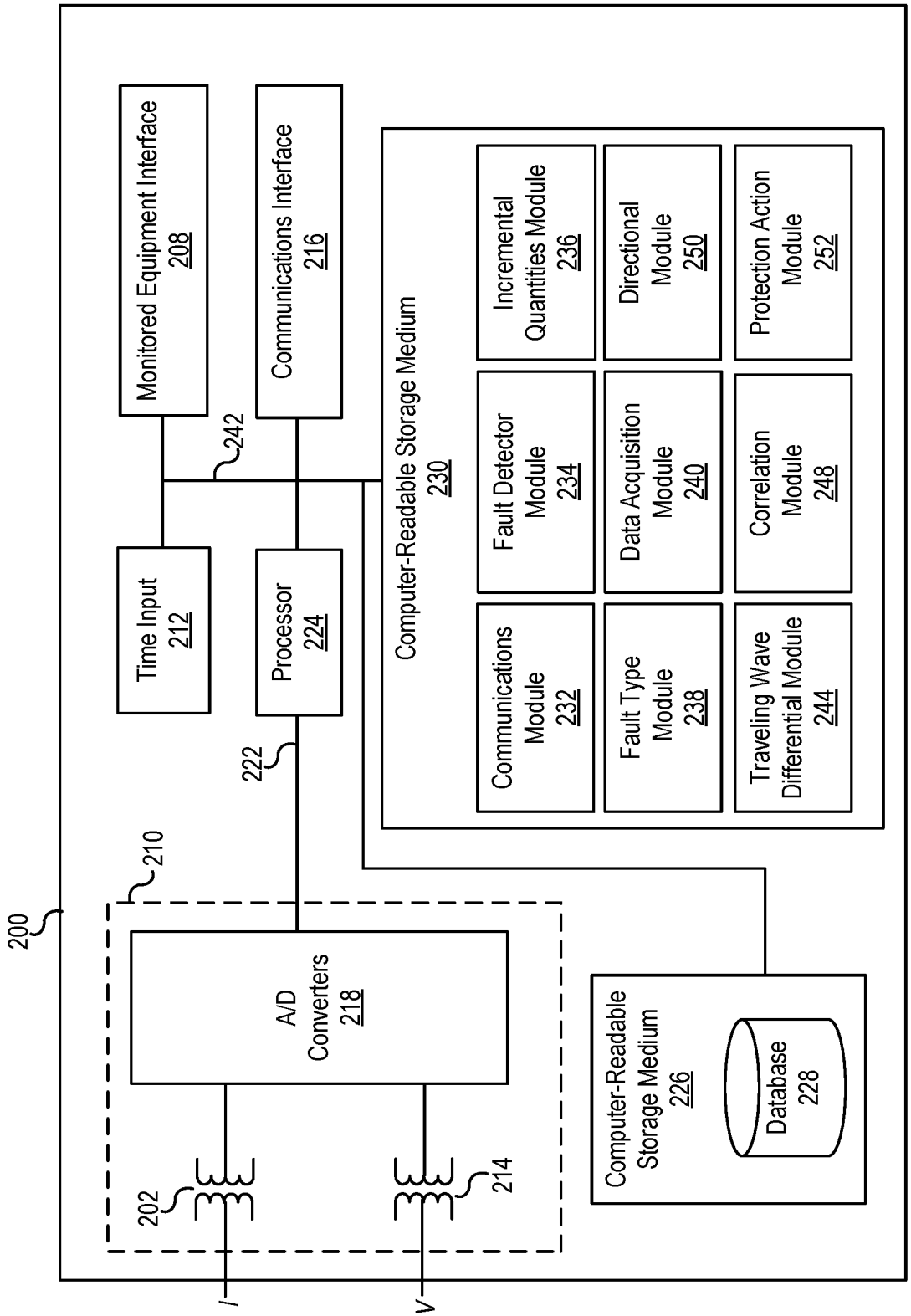
FIG. 2 illustrates a simplified block diagram of an apparatus for detecting traveling waves on an electric power delivery system consistent with certain embodiments of the present disclosure.

FIG. 2 illustrates a simplified block diagram of one example of an IED 200 that may be used to detect events on an electric power delivery system using time domain and/or traveling wave principles consistent with certain embodiments of the present disclosure. In certain embodiments, the system 200 may comprise an IED system configured to, among other things, obtain and calculate time-domain quantities, detect and locate faults using a time-domain distance module, detect and locate faults using a time-domain directional module, and detect and locate faults using traveling waves. System 200 may be implemented using hardware, software, firmware, and/or any combination thereof. In some embodiments, system 200 may be embodied as an IED, while in other embodiments, certain components or functions described herein may be associated with other devices or performed by other devices. The specifically illustrated configuration is merely representative of one embodiment consistent with the present disclosure.

System 200 includes a communications interface 216 configured to communicate with devices and/or IEDs. In certain embodiments, the communications interface 216 may facilitate direct communication with other IEDs or communicate with IEDs or systems over a communications network. System 200 may further include a time input 212, which may be used to receive a time signal (e.g., a common time reference) allowing system 200 to apply a time-stamp to the acquired samples. In certain embodiments, a common time reference may be received via communications interface 216, and accordingly, a separate time input may not be required for time-stamping and/or synchronization operations. One such embodiment may employ the IEEE 1588 protocol. A monitored equipment interface 208 may be configured to receive status information from, and issue control instructions to, a piece of monitored equipment (such as a circuit breaker, conductor, transformer, or the like).

Processor 224 may be configured to process communications received via communications interface 216, time input 212, and/or monitored equipment interface 208. Processor 224 may operate using any number of processing rates and architectures. Processor 224 may be configured to perform various algorithms and calculations described herein. Processor 224 may be embodied as a general purpose integrated circuit, an application specific integrated circuit, a field-programmable gate array, and/or any other suitable programmable logic device.

In certain embodiments, system 200 may include a sensor component 210. In the illustrated embodiment, sensor component 210 is configured to gather data directly from conventional electric power system equipment such as a conductor (not shown) using conventional PTs and/or CTs. The sensor component 210 may use, for example, transformers 202 and 214 and A/D converters 218 that may sample and/or digitize filtered waveforms to form corresponding digitized current and voltage signals provided to data bus 222. Current (I) and voltage (V) inputs may be secondary inputs from conventional instrument transformers such as, CTs and VTs. A/D converters 218 may include a single A/D converter or separate A/D converters for each incoming signal. A current signal may include separate current signals from each phase of a three-phase electric power system. A/D converters 218 may be connected to processor 224 by way of data bus 222, through which digitized representations of current and voltage signals may be transmitted to processor 224. In various embodiments, the digitized current and voltage signals may be used to calculate time-domain quantities for the detection and the location of a fault on an electric power system as described herein.

A computer-readable storage medium 226 may be the repository of a database 228 containing electric power line properties for each transmission line and/or each section of each transmission line, such as impedances, resistances, propagation times, reactances, lengths, and/or the like. Another computer-readable storage medium 230 may be the repository of various software modules configured to perform any of the methods described herein. A data bus 242 may link monitored equipment interface 208, time input 212, communications interface 216, and computer-readable storage mediums 226 and 230 to processor 224.

Computer-readable storage mediums 226 and 230 may be separate mediums, as illustrated in FIG. 2, or may be the same medium (i.e. the same disk, the same non-volatile memory device, or the like). Further, the database 228 may be stored in a computer-readable storage medium that is not part of the system 200, but that is accessible to system 200 using, for example, communications interface 216.

Communications module 232 may be configured to allow system 200 to communicate with any of a variety of external devices via communications interface 216. Communications module 232 may be configured for communication using a variety of data communication protocols (e.g., UDP over Ethernet, IEC 61850, etc.).

Data acquisition module 240 may collect data samples such as the current and voltage quantities and the incremental quantities. The data samples may be associated with a timestamp and made available for retrieval and/or transmission to a remote IED via communications interface 216. Traveling waves may be measured and recorded in real-time, since they are transient signals that dissipate rapidly in an electric power delivery system. Data acquisition module 240 may operate in conjunction with fault detector module 234. Data acquisition module 240 may control recording of data used by the fault detector module 234. According to one embodiment, data acquisition module 240 may selectively store and retrieve data and may make the data available for further processing. Such processing may include processing by fault detector module 234, which may be configured to determine the occurrence of a fault with an electric power distribution system.

An incremental quantities module 236 may be configured to calculate time domain incremental quantities. The incremental quantities module 236 may be configured to use digitized representations of current and/or voltage measurements to calculate incremental quantities therefrom. In some embodiments, system 200 may be one of a pair of IEDs in communication with different terminals on an electric power system such as the IEDs and system of FIG. 1. In one embodiment, each IED of a pair of IEDs calculates incremental quantities in its own incremental quantities module 236 for later processing and sharing between the IEDs. In another embodiment, system 200 may receive digitized representations from both the sensor component 210 and from a remote IED over a communications channel, and the incremental quantities module 236 may be configured to calculate incremental signals from both sources to calculate both local and remote incremental quantities.

A fault type module 238 may be configured to determine a fault type using incremental quantities from module 236. In various embodiments, the several different types of faults may occur. For example, in multi-phase systems types of faults may include single-phase-to-ground faults, phase-to-phase faults, phase-to-phase-to-ground faults, three-phase faults, and the like. In several embodiments herein, the fault detection and location calculation may be independent from the fault type in the actual multiple-phase power system.

Traveling wave differential module 244 may determine if a fault is internal to a line using currents by making assumptions of fault direction, and checking amplitudes of the traveling waves. In various embodiments, control actions may be implemented to clear internal faults.

A correlation module 248 may be configured to receive local data values and remote data values, and to correlate them for use in analyzing traveling waves. The correlation may be done by time alignment using time stamps. In some embodiments, the local data values may be determined using sensor component 210 and the remote data values may be receive through communications interface 216

A directional module 250 may be configured to determine a direction (forward or reverse) to a fault. The directional module 250 may be configured to use incremental quantities from incremental quantities module 236 to determine a direction to a fault. In other embodiments, directional module 250 may be configured to determine the direction based on the polarity of traveling waves. In such embodiments, the polarities of the voltage and current traveling waves are opposite if the fault is in the forward direction. If the fault is in the reverse direction, the voltage and current traveling waves have the same polarity.

One or more of the modules may be configured to determine a location of the fault using traveling waves and/or time domain principles. For example, the traveling wave differential module 244 may calculate a fault location (or distance to the fault) using detection of two or more traveling waves.

A protective action module 252 may be configured to implement a protective action based on the declaration of a fault by the fault detector module 234. In various embodiments, a protective action may include tripping a breaker, selectively isolating a portion of the electric power system, etc. In various embodiments, the protective action module 252 may coordinate protective actions with other devices in communication with system 200.

System 200 may be configured to detect a fault on an electric power delivery system using traveling wave and/or incremental quantity principles. This, the system 200 may be a high-speed power system fault detector, configured to detect sub-cycle events on the electric power delivery system. Common practice in electric power delivery is to test protective systems, such as system 200, to ensure that it is properly set to detect faults. System 200 may simulate fault conditions by providing current and/or voltage signals to the sensor component 210 and/or to communication information regarding electrical conditions to the communications interface 216. System 200 may generate current or voltage signals corresponding with a current or voltage signal from a current transformer or potential transformer of an electric power delivery system typically in communication with an IED. System 200 may vary the timing, frequency and/or magnitude of the current and voltage signals, as well as the relative angles and magnitudes of different phases of current and voltage signals, in order to simulate different fault conditions, different types of faults, and different fault locations.

Figure 3:
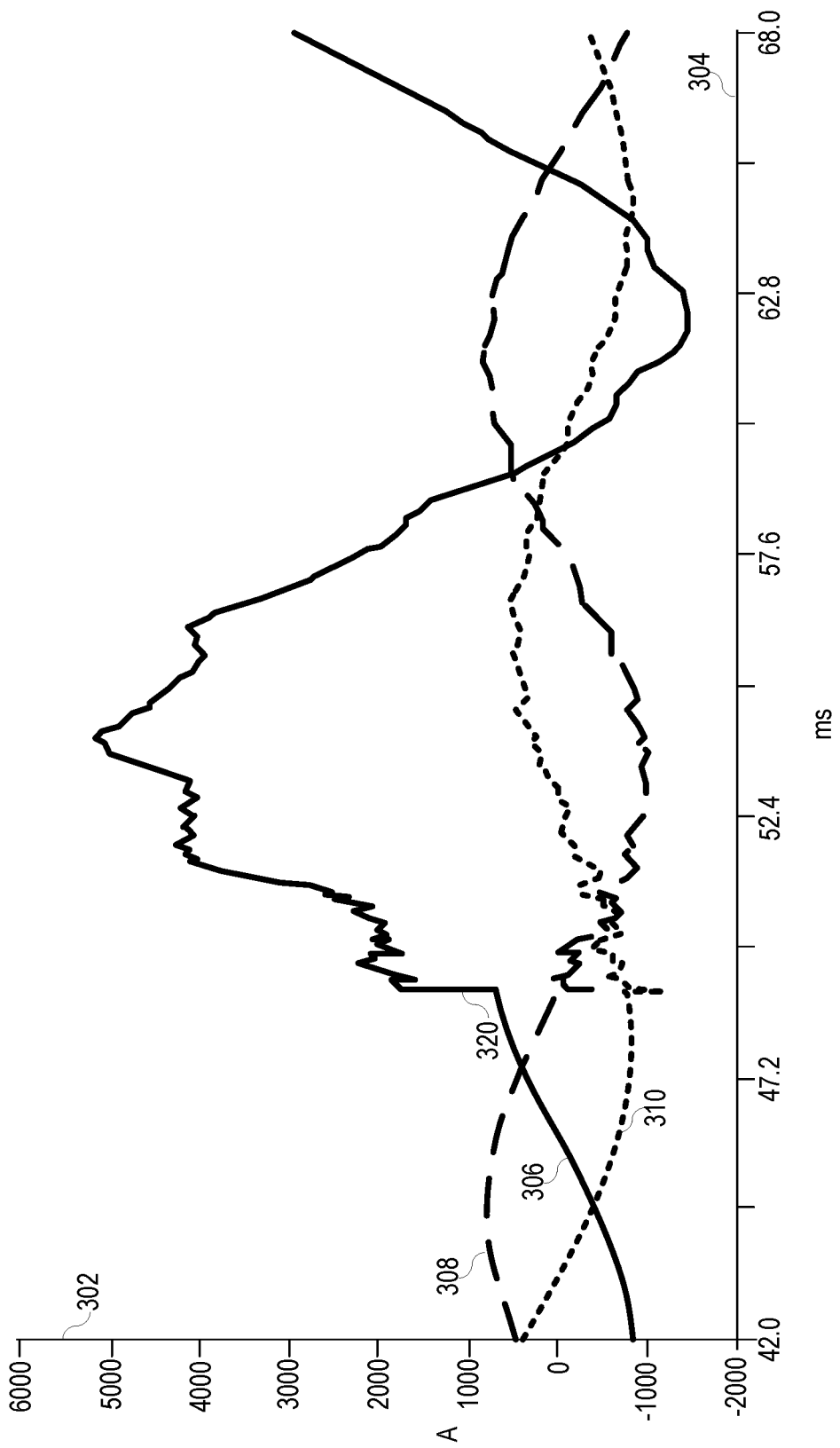
FIG. 3 illustrates a plot of current values for three electrical phases during a traveling wave event consistent with certain embodiments of the present disclosure.

FIG. 3 illustrates current waveforms of three phases 306, 308, and 310 of an electric power delivery system during a fault consistent with certain embodiments of the present disclosure. Current magnitudes 302 are plotted against time 304. At about time 49 ms, a fault signal is exhibited by a step change 320. Such step change 320 indicates the arrival of the traveling wave from the fault to the device recording the electric power delivery signals. Various embodiments consistent with the present disclosure may be configured to simulate the results of a fault, such as the fault illustrated in FIG. 3, for purposes of testing protective equipment for use in an electrical power system.

Figure 4:
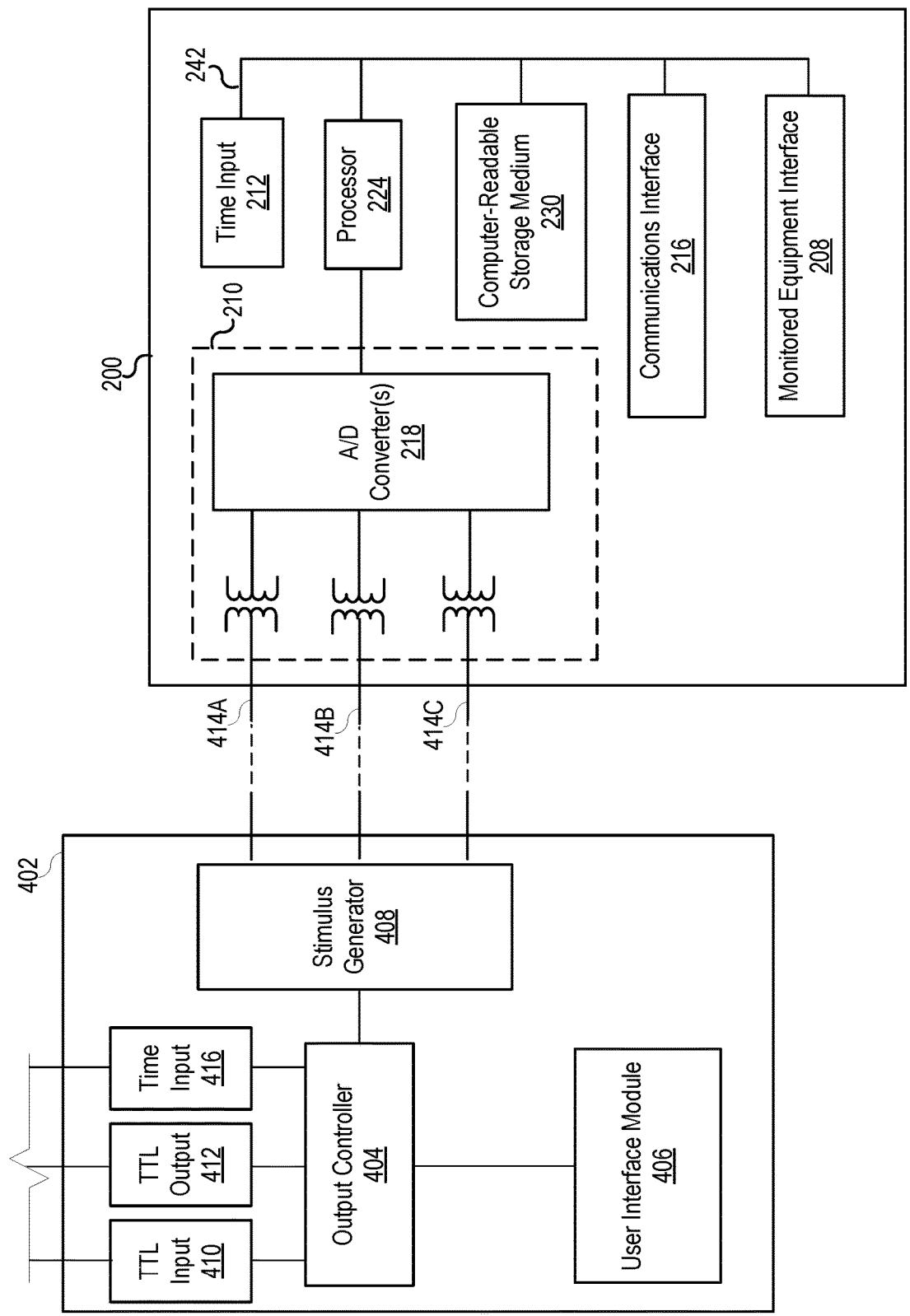
FIG. 4 illustrates a testing apparatus 402 configured to generate a test signal and launch a traveling wave signal to a fault detector 200 consistent with certain embodiments of the present disclosure.

FIG. 4 illustrates a testing apparatus 402 configured to generate a test signal and launch a traveling wave signal to a fault detector 200 consistent with certain embodiments of the present disclosure. The testing apparatus 402 includes a stimulus generator 408 configured to launch a traveling wave signal to an electrical signal supplied to the fault detector 200. The stimulus generator 408 may supply the launched traveling wave signal, or the stimulus generator 408 may impose the traveling wave signal onto an electrical signal supplied by another electrical signal generator. In some embodiments, the electrical signal generator may be a separate device, which may be a typical test set as discussed above. In some embodiments, the stimulus generator 408 provides the traveling wave signal as current signals to current inputs of the fault detector 200.

In the illustrated embodiment, the stimulus generator 408 is configured to provide three signals to the fault detector 200. In some embodiments, the stimulus generator 408 provides the traveling wave signal as voltage signals to voltage inputs of the fault detector 200. In some embodiments, the stimulus generator 408 provides both current signals to the fault detector 200. Furthermore, the stimulus generator 408 may be configured to provide both current and voltage signals and/or to provide signals for multiple phases to fault detector 200. In one particular embodiment, the stimulus generator 408 may be configured to provide current and/or voltage signals to multiple fault detectors.

The stimulus generator 408 includes three outputs, in communication with the A-phase input 414A, B-phase input 414B, and C-phase input 414C of the fault detector 200. Stimulus generator 408 is configured to launch the traveling wave signal as one or more of the current and/or voltage signals.

Testing apparatus 402 further includes an output controller 404 in communication with the stimulus generator 408 configured to control the stimulus generator 408. In particular, the output controller 404 may control the opening and closing of switches within the stimulus generator for imposing the traveling wave signal on an electrical signal provided to fault detector 200.

Output controller 404 may be controllable using a user interface module 406. The user interface module 406 may be in communication with the output controller and accept inputs from a user interface. The user interface may be a separate device such as a laptop computer, desktop computer, tablet computer, or other computer in communication with the testing apparatus 402. Further, the user interface module 406 may be in communication with a user interface integral with the testing apparatus 402 such as front-panel controls. Front panel controls may include pushbuttons, a display, a touch-screen display, rotary dials, switches, and the like. User interface module 406 may be configured to receive inputs from a user.

Testing apparatus 402 may further include a transistor-transistor logic ("TTL") input module 410 and a TTL output module 412 in communication with the output controller 404. The TTL inputs module 410 may be configured to accept a TTL signal to trigger the stimulus generator to impose a traveling wave signal on the electric power signal. In some embodiments, the TTL input module may include a TTL input for each phase, such that traveling wave signals may be imposed on separate phase electrical signals. In some embodiments, TTL input module 410 may be in communication with a test set such that the test set may control the imposition of the traveling wave signal on the electric test signal to the fault detector 200. The TTL output module 412 may be configured to output a TTL signal when the stimulus generator imposes the traveling wave signal on the electric power signal to the fault detector. TTL output module 412 may be in communication with a device, such as a test set in communication with the fault detector 200, for recording an action from the fault detector 200 in response to the traveling wave signal.

The testing apparatus 402 may further include a time input 416 for receiving a common time signal. Time input 416 may be embodied, for example, as an input capable of receiving a time signal in the IRIG-B format. In one specific embodiment, time input 416 may be configured to connect to a GPS receiver configured to determine a time signal based on a GPS signal. Time input 416 may be used to synchronize testing apparatus 402 with a fault detector 200. In some embodiments, a common time signal may be provided to time input 416 and time input 212 to synchronize the devices. In some embodiments, the timing of fault signal injection and detection may be recorded and compared for testing purposes.

Output controller 404 may be programmable using the user interface module 406. In some embodiments, the output controller 404 may be programmable to control the imposition of traveling waves such that the timing of the traveling waves simulate a fault on an electric power delivery system at a predetermined location on the electric power delivery system. In an electric power delivery system, a traveling wave may be launched from the position of a fault, and reflected at discontinuities of the electric power delivery system. Thus, the time between receipt of the traveling waves may be used to determine a location of the fault. By programming the timing of imposition of simulated traveling waves, the testing apparatus 402 may be configured to test whether the fault detector can accurately detect a fault using traveling waves and/or incremental quantities, and determine a location of a fault using the traveling waves and/or incremental quantities.

In one embodiment, the user interface module may be configured to receive instructions regarding a distance to a fault, a faulted phase, and a start trigger. The output controller 404 may then calculate the appropriate time for injecting various signals to simulate a corresponding fault. The time for injecting the fault may vary based on the location of the fault, the length of a simulated transmission line, the line propagation velocity, etc. Eqs. 1 and 2 may be used to calculate the appropriate time based on, among other things, user input relating to a distance to the fault. Upon receipt of the start trigger (for example, through a pushbutton on the front panel, a predetermined time, a TTL input, a specified time based on an external time signal, or the like), the output controller 404 may control the stimulus generator 408 to impose traveling wave signals on electrical signals at the determined times and on the predetermined phase.

Figure 5:
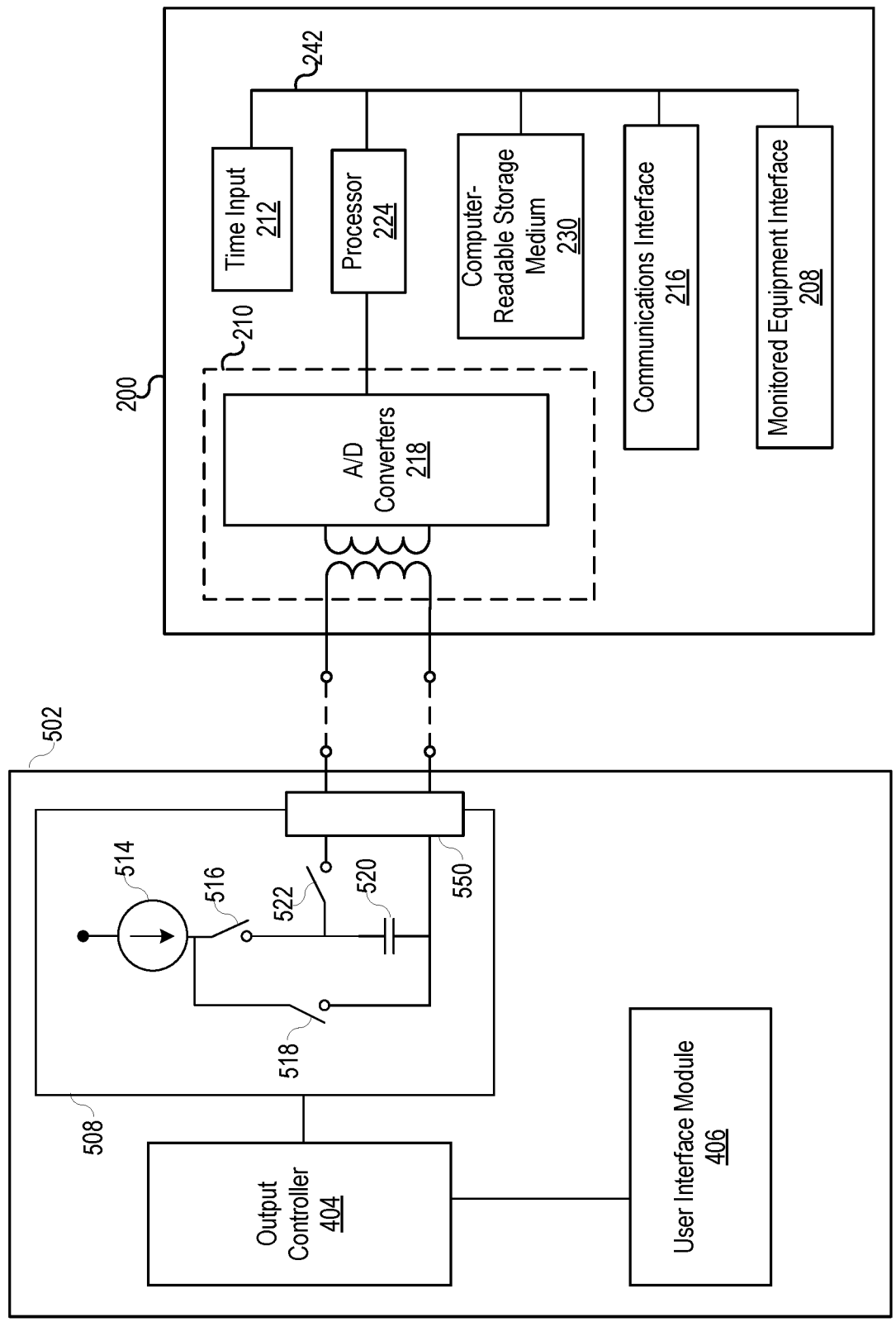
FIG. 5 illustrates a functional block diagram of a traveling wave testing apparatus in communication with a traveling wave detector consistent with certain embodiments of the present disclosure.

FIG. 5 illustrates a functional block diagram of a traveling wave testing apparatus 502 in communication with a fault detector 200 consistent with certain embodiments of the present disclosure. The stimulus generator 508 may include a current source 514. The stimulus generator 508 may include two output contacts per phase, which may be in communication with the two input contacts for a single transformer of a fault detector. Capacitor 520 may be used to impose the traveling wave signal on an electric power signal. Initial charging of the capacitor 520 may be performed using switches 518 and 516. A traveling wave signal may be imposed on by the fault 200 by discharging the capacitor 520 using switch 522. Switches 516, 518, and 522 may be transistors such as MOSFETs. Switches 516, 518, and 522 may be controlled by the output controller 404 such that discharge of the capacitor 520 may impose the traveling wave signal on the electric power system signal at the determined times. Furthermore, switches 516, 518, and 522 may be controlled by the output controller 404 upon receipt of a TTL signal from the TTL input module, input from the user interface module (such as a front panel pushbutton), a specified time based on a time input, or the like.

Figure 7:
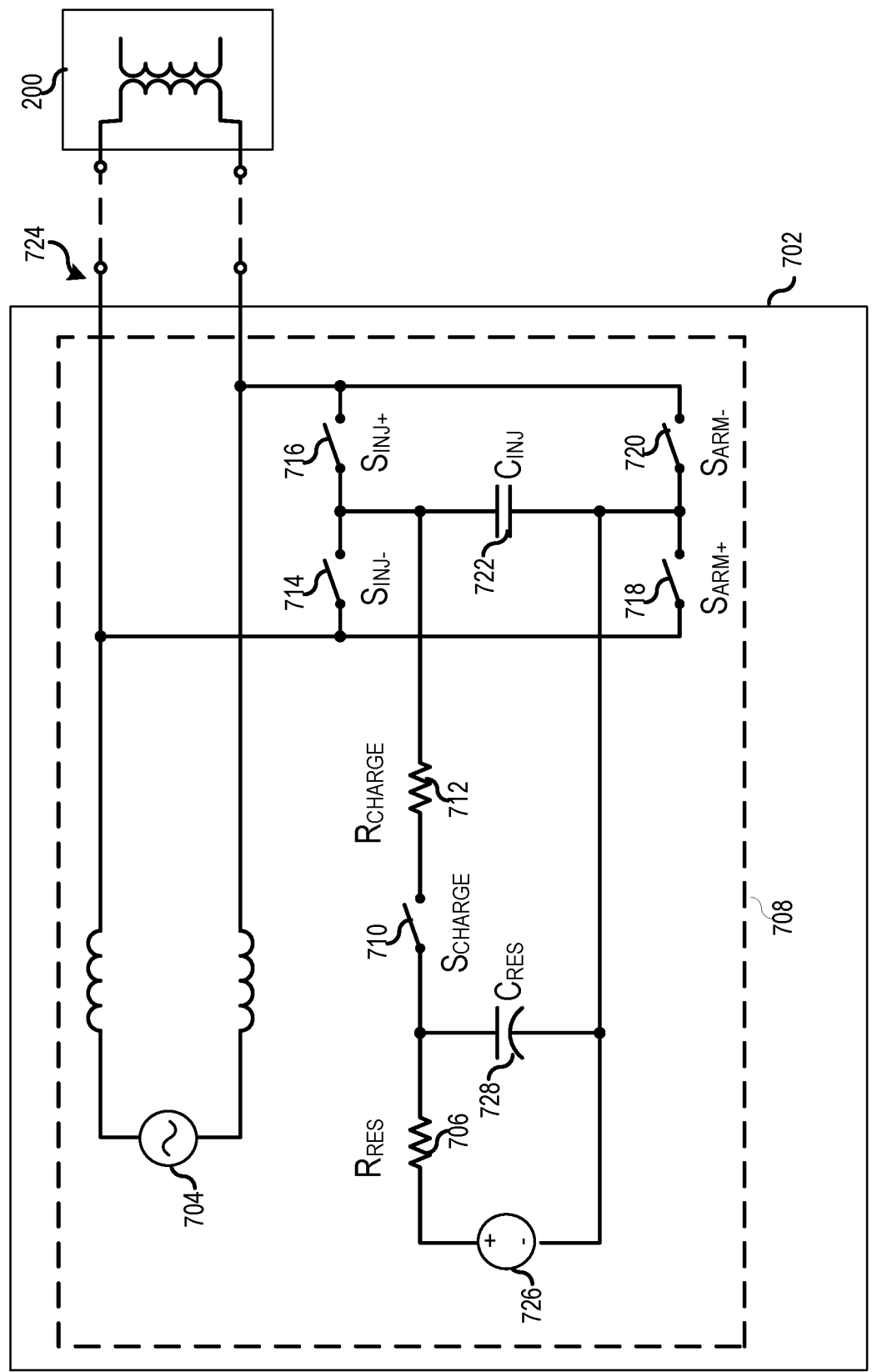
FIG. 7 illustrates a circuit diagram for creating and injecting a traveling wave signal using a signal generator consistent with certain embodiments of the present disclosure.

In the illustrated embodiment, the testing apparatus 502 includes a polarity module 550 between the stimulus generator 508 and the fault detector 200. The polarity module 550 may be configured to introduce the test traveling wave signal at a predetermined polarity for delivery to the fault detector 200. The polarity module 550 may include a plurality of switches such as MOSFETs that may be used to control the polarity of the test traveling wave signal. In one specific embodiment, and as discussed in greater detail below, the polarity module may be configured as shown in FIG. 7. In another embodiment, the polarity module 550 may include double pole, double throw relays to control the polarity of the test traveling wave signal.

Figure 6:
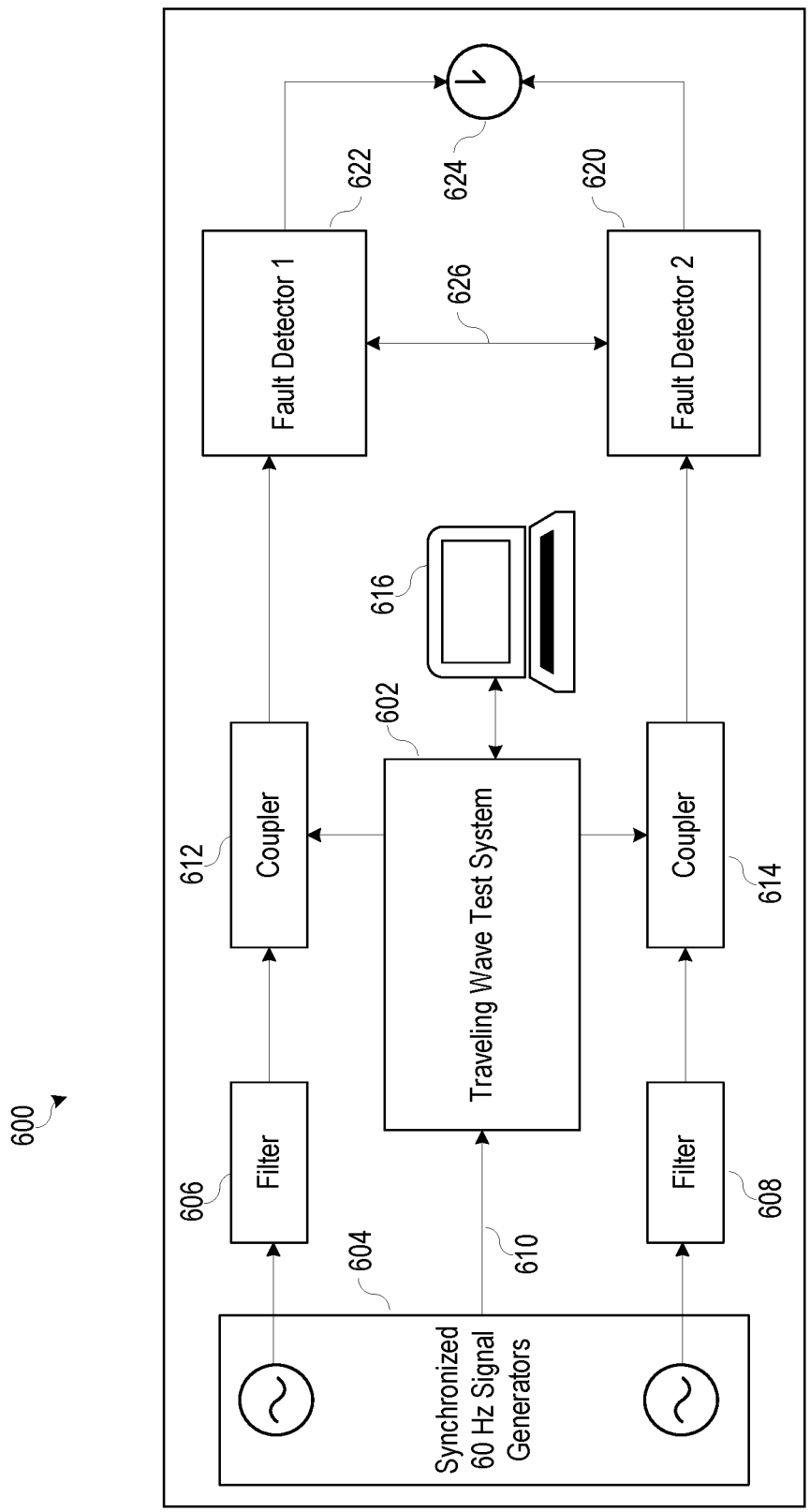
FIG. 6 illustrates a system for testing a plurality of traveling wave detectors consistent with certain embodiments of the present disclosure.

FIG. 6 illustrates a system 600 for testing a plurality of traveling wave detectors 620 and 622 consistent with certain embodiments of the present disclosure. System 600 includes one or more electric system signal generators 604. In various embodiments, signal generators 604 may generate typical electrical signals associated with a multi-phase electric power system. The signal generators 604 may be in communication through a communication channel 610 with a traveling wave test system 602. In one configuration of system 600, fault detectors 620, 622 may be tested as if they were at two ends of a transmission line in an electric power delivery system. Fault detectors 620, 622 may be configured to detect and/or classify a fault using traveling wave signals and/or incremental quantities. For example, fault detectors 620 and 622 may be differential relays configured to determine a fault condition and location using traveling waves and/or incremental quantities.

Electric power signals may be provided to the fault detectors 620, 622 through, for example, filters 606, 608 and couplers 612, 614. A testing apparatus 602 may be configured to impose traveling wave signals on the electric system signals from the generators 604 through couplers 612 and 614. Signal generators 604 may provide the testing signal to a first fault detector 622 and a second fault detector 620. Filters 606 and 608 may be configured to prohibit imposition of the traveling wave signals generated by the traveling wave test system 602 back on the signal generators 604. Couplers 612, 614 may be configured to allow for imposition of the traveling wave signals from the traveling wave test system 602 on the electric system signal from the generators 604 to the fault detectors 620, 622.

The traveling wave test system 602 may be in communication with an interface such as computer 616. Computer 616 may be configured to coordinate the operation of the traveling wave test system 602 and to analyze the results of the test. In various embodiments, the traveling wave test system 602 may be embodied as the testing apparatus 402 (illustrated in FIG. 4), the testing apparatus 502 (illustrated in FIG. 5). Fault detectors 620, 622 may be in communication with a common time source, such as a GPS system 624. As described herein, the traveling wave test system 602 may be configured to impose traveling wave signals at the same or different times on the same or different phases of electric signals to the fault detectors 620, 622. In one example, the traveling wave test system 602 may be configured by a user to simulate a fault on an electric power system on a first phase closer to the first fault detector 620 than the second fault detector 622. Testing apparatus 602 may determine a time for imposing a traveling wave signal on the first phase to the first fault detector 620 and a time for imposing a traveling wave signal on the first phase to the second fault detector 622 depending on the simulated location of the fault.

A data communication path 626 may allow the fault detectors 620, 622 to exchange information about traveling waves. Such information may include the time that an initial traveling wave is detected, times that reflections of the traveling waves are detected, polarity of the traveling waves, magnitude of the traveling waves, etc. In various embodiments, information regarding electrical conditions detected by the respective devices may be communicated as a stream of time-synchronized measurements.

FIG. 7 illustrates a simplified circuit diagram for a testing apparatus 702 for creating and injecting a traveling wave signal using a signal generator 708 consistent with certain embodiments of the present disclosure. Signal generator 708 may be configured to generate a sinusoidal signal representative of an alternating current in an electric distribution system. In various embodiments, multiple signal generators may be included to simulate multiple phases on an electrical power system. In the illustrated embodiment, the testing apparatus 702 comprises the signal generator 704. In other embodiments, the electric signal generator may be external to the testing apparatus 702.

The signal generator 708 includes a circuit for imposing the traveling wave signal on the electric system signal from generator 704. The circuit may include a voltage source 726 in electrical communication with a reservoir resistor 706 and reservoir capacitor 728. A charging switch 710 may be used to charge an injection capacitor 722 through a charging resistor 712. Once the injection capacitor 722 is charged, charging switch 710 may be opened. The injection capacitor 722 may then be discharged by selectively connecting the injection capacitor 722 to an output 724 using switches 718 and 716 or switches 714, and 720. By controlling the opening and closing of switches 714-720, the time and polarity of the traveling wave signal imposed on the electric power system signal may be controlled. For example, a traveling wave with a first polarity may be imposed by closing switches 718 and 716, and a traveling wave with a second polarity may be imposed by closing switches 714 and 720. As discussed further herein, switches 710 and 714-720 may be transistors such as MOSFETs. Testing apparatus 702 may include separate signal generators 708 for each phase being test. In some embodiments, testing apparatus 702 may include six separate signal generators 708, three for the three phases to a first fault detector, and three for the three phases to a second fault detector. The output 724 of testing apparatus 702 may be provided to a test device 200.

Figure 8:
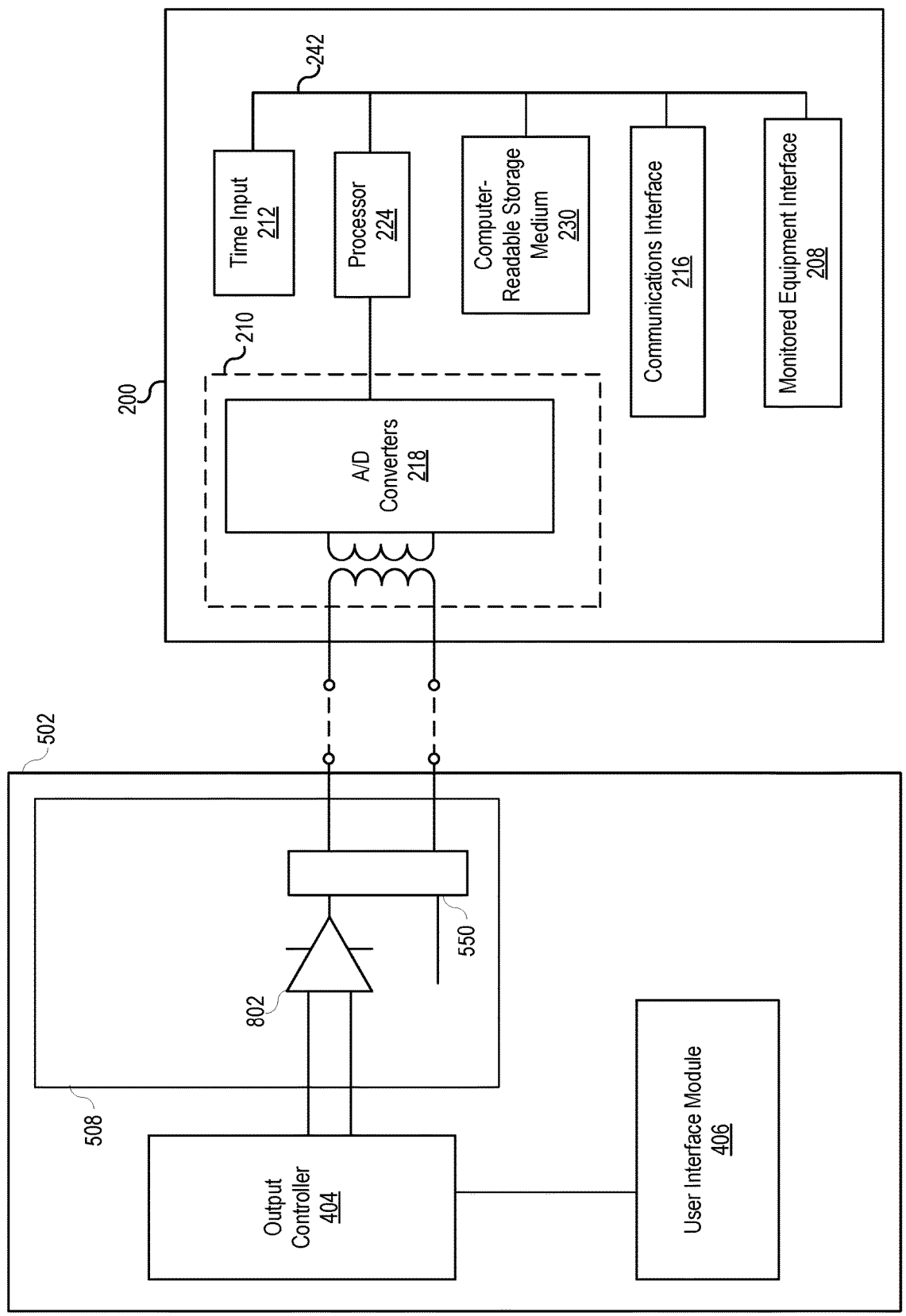
FIG. 8 illustrates a functional block diagram of a traveling wave testing apparatus using an amplifier in communication with a traveling wave detector consistent with certain embodiments of the present disclosure.

FIG. 8 illustrates a block diagram of a traveling wave testing apparatus consistent with embodiments of the present disclosure. In the illustrated embodiment, the test traveling wave signal is generated using an amplifier 802. The output of the amplifier may generate a step function that is imposed on a test signal. The amplifier 802 may be controlled by the output controller 404. The amplifier 802 may be in communication with the polarity module 550 for controlling a polarity of the test traveling wave signal. In one particular embodiment, the amplifier 802 is internal to the testing apparatus 502. In another embodiment, the amplifier may be a separate module from the testing apparatus 502. In such embodiments, output contacts, TTL outputs, or the like of the testing apparatus 502 may be in electrical communication with the amplifier 802 for controlling generation of the test traveling wave signal. In certain embodiments, the polarity module 550 may be electrically coupled to the amplifier 802 to control the polarity of the output of the amplifier 802 to the test device 200.

According to yet another embodiment, the test device 502 may include a stimulus generator 508 that may include a flyback converter to generate the test traveling wave signal.

The several embodiments of the testing device disclosed herein may be broadly used to generate a test traveling wave signal for a test device, or a plurality of test devices. In several embodiments herein, the testing device may be configured to provide a series of test traveling wave signals to the test device or test devices. For example, embodiments illustrated in FIGS. 5 and 8 include stimulus generators 508 configured to generate and transmit test traveling wave signals. In one embodiment, a series of traveling wave signals may be generated and transmitted to the test device. The test traveling wave signals may be of different polarities.

The test device may be configured to signal other devices to generate and transmit a test traveling wave to the test device. Several test devices may be in communication and synchronized using a common time source such that test traveling wave signals are generated in coordination to test a plurality of test devices (such as devices that are not physically collocated).

In some embodiments, the output controller 404 may store a variety of fault scenarios. Such scenarios may include varied line lengths, fault locations, fault intensities, etc. These scenarios may be used to test a device or a plurality of devices using known parameters. Such tests may be conducted to ensure that a test device responds as expected to a plurality of fault scenarios. In one specific example, a manufacturer may utilize a variety of test scenarios to test devices before such devices are sold. The output controller 404 may be configured in some scenarios to implement a plurality of fault scenarios as part of an automated or semi-automated testing process.

Still further, the output controller 404 may be configured to control the stimulus generator to generate traveling waves based on particular user instructions. For example, a user may provide specific testing scenarios by indicating one or more aspects of the test. Such aspects may include adjustments to the timing, phase, polarity, amplitude, and other parameters of the traveling waves. In one embodiment, the output controller may be configured to accept a location of a fault from a user, and to determine timing and polarities of a first test traveling wave signal and subsequent traveling wave signals.

The output controller may be configured to control generation of traveling wave time and polarities for a plurality of test devices such that the plurality of test devices may be tested for coordination of fault detection and location calculations. In one embodiment, the output controller may be configured to accept information regarding a power system topology, and further configured to determine timing and polarities of test traveling wave signals based on the topology and user input fault location. In one embodiment, the output controller may be configured to control generation of a plurality of test traveling wave signals corresponding with several simulated faults at different times and different locations on the simulated electric power system.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A traveling wave test system for testing a high-speed electrical power system fault detector, comprising:
   a stimulus generator configured to generate a representation of an electric power system signal;
   the traveling wave test system configured to generate a plurality of traveling wave signals of a simulated fault to be imposed on the representation of the electric power system signal from the stimulus generator, the traveling wave test system comprising:
      an input configured to receive a control signal to control times at which the plurality of traveling wave signals are to be imposed on the representation of the electric power system signal;
      an output controller configured to control the imposition of the traveling wave signals onto the representation of the electric power system signal based on the control signal received at the input; and,
      a coupler configured to impose the plurality of traveling wave signals onto the representation of the electric power system signal.

2. The traveling wave test system of claim 1, wherein the traveling wave test system is further configured to impose a delay between each of the plurality of traveling wave signals.

3. The traveling wave test system of claim 2, wherein the delay between each of the plurality of traveling wave signals is determined based on a simulated fault location.

4. The traveling wave test system of claim 1, further comprising a user interface module in communication with the input, the user interface module configured to receive instructions from a user regarding the times at which the plurality of traveling wave signals are imposed onto the representation of the electric power system signal.

5. The traveling wave test system of claim 1, wherein the plurality of traveling wave signals comprise at least one simulation of a reflection of an initial wave front of a simulated fault.

6. The traveling wave test system of claim 1, further comprising:
   a voltage output configured to provide a first subset of the plurality of traveling wave signals to a voltage input of the fault detector; and
   a current output configured to provide a second subset of the plurality of traveling wave signals to a current input of the fault detector.

7. A system to test at least one high-speed electrical power system fault detector, the system comprising:
   a stimulus generator configured to generate a representation of an electric power system signal;
   a traveling wave test system configured to generate a traveling wave signal to be imposed on the representation of the electric power system signal; and
   an output controller in communication with the stimulus generator and the traveling wave test system and configured to cause the stimulus generator to provide the representation of the electric power system signal and the traveling wave signal to the at least one fault detector.

8. The system of claim 7, wherein the traveling wave signal comprises an initial wave front, and the traveling wave test system is further configured to generate a representation of a reflection of the traveling wave after a delay.

9. The system of claim 8, wherein the delay is determined based on a simulated fault location.

10. The system of claim 7, wherein the traveling wave test system further comprises an injection capacitor configured to be selectively discharged to create the traveling wave signal.

11. The system of claim 10, wherein the traveling wave test system further comprises an electrical source configured to charge a reservoir capacitor, and wherein the reservoir capacitor is configured to selectively charge the injection capacitor through a charge resistor.

12. The system of claim 7, wherein the representation of the electric power system signal comprises a sinusoidal signal.

13. The system of claim 7, wherein the traveling wave test system further comprises an amplifier configured to create the traveling wave signal.

14. The system of claim 7, wherein the output controller further comprises an input configured to receive a signal to control a time at which the traveling wave signal is imposed on the representation of an electric power system signal.

15. The system of claim 14, wherein the input comprises a transistor-transistor logic input.

16. The system of claim 14, wherein the input comprises a time input.

17. The system of claim 14, wherein the input is configured to connect to the at least one high-speed electrical power system fault detector.

18. The system of claim 7, wherein the apparatus is configured to provide a plurality of traveling wave signals to a first high-speed electric fault detector and a second high-speed electric fault detector.

19. The system of claim 18, wherein the traveling wave test system is further configured to generate the plurality of traveling wave signals, each of the plurality of traveling wave signals separated by a delay, and the traveling wave test system is further configured to determine the delay between each of the plurality of traveling wave signals based on a simulated fault location.

20. The system of claim 7, further comprising a user interface module in communication with the output controller, the user interface module configured to receive instructions from a user to impose the traveling wave signal on the representation of the electric power system signal.

* * * * *